Figure 1:
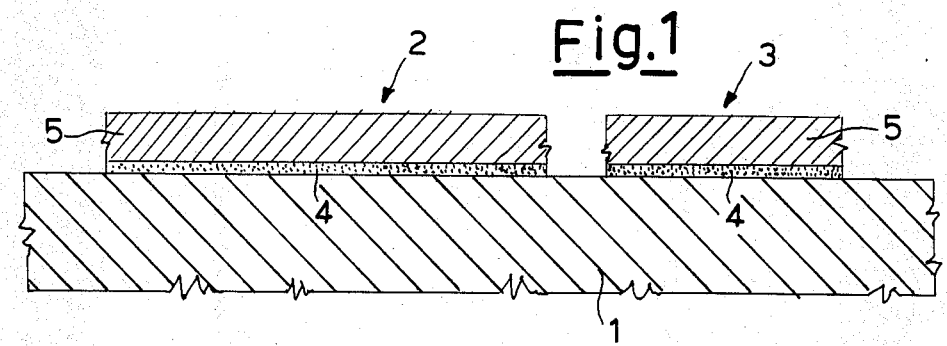

United States Patent [19]

Ghidini et al.

[11] Patent Number: 4,808,261
[45] Date of Patent: Feb. 28, 1989

[54] FABRICATION PROCESS FOR EPROM CELLS WITH OXIDE-NITRIDE-OXIDE DIELECTRIC

[75] Inventors: Gabriella Ghidini, Piacenza; Giuseppe Crisenza, Trezzo Sull'adda, both of Italy

[73] Assignee: SGS Microelettronica S.p.A., Catania, Italy

[21] Appl. No.: 40,152

[22] Filed: Apr. 20, 1987

[30] Foreign Application Priority Data

Apr. 29, 1986 [IT] Italy .............................. 20253 A/86

[51] Int. Cl.$^4$ ...................... H01L 21/306; B44C 1/22; C03C 15/00; C03C 25/06
[52] U.S. Cl. ................................... 156/653; 156/657; 156/659.1; 156/662; 357/23.5; 357/59; 437/52; 437/191; 437/233
[58] Field of Search ................. 156/652, 653–657, 156/659.1, 661.1, 662; 357/23.1, 23.5, 23.6, 49, 59, 23.14; 437/43, 48, 49, 52, 191, 228, 233, 235, 238, 241

[56] References Cited

U.S. PATENT DOCUMENTS

| | | | |
|---|---|---|---|
| 4,426,764 | 1/1984 | Kosa et al. | 357/23.5 X |
| 4,458,407 | 7/1984 | Hoeg et al. | 357/59 X |
| 4,688,078 | 8/1987 | Hseih | 357/23.5 X |
| 4,720,323 | 1/1988 | Sato et al. | 437/69 |

Primary Examiner—William A. Powell
Attorney, Agent, or Firm—Cushman, Darby & Cushman

[57] ABSTRACT

The process calls for covering of the dielectric with a thin additional layer of polysilicon which has the function of protecting the dielectric from any defects which would otherwise be introduced from the subsequent masking.

4 Claims, 2 Drawing Sheets

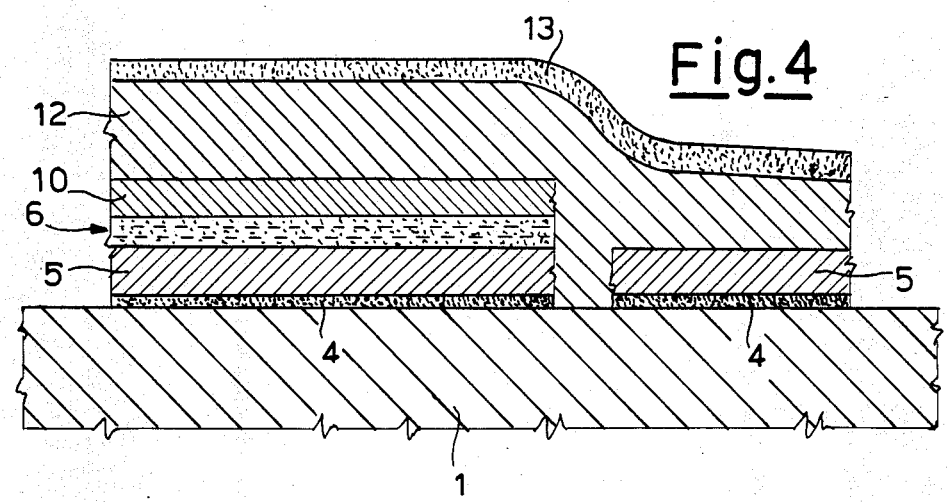
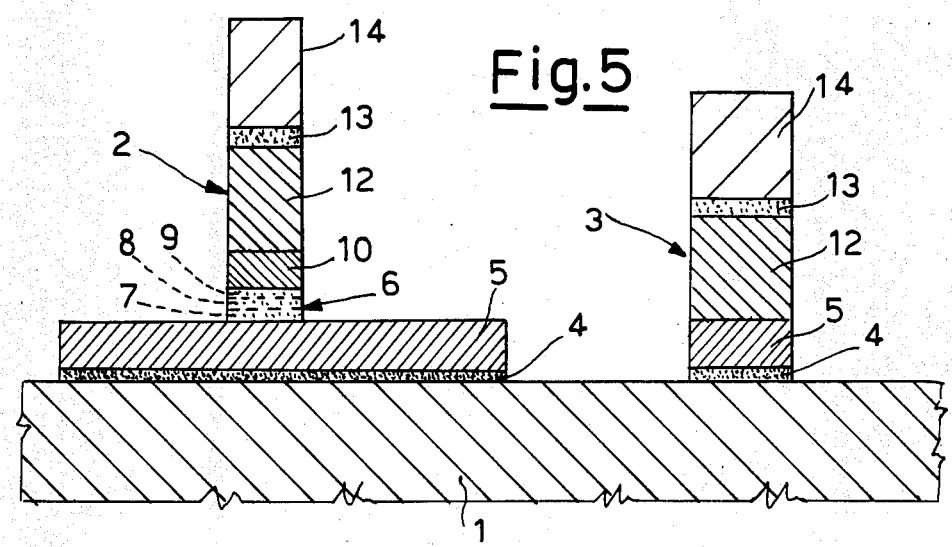
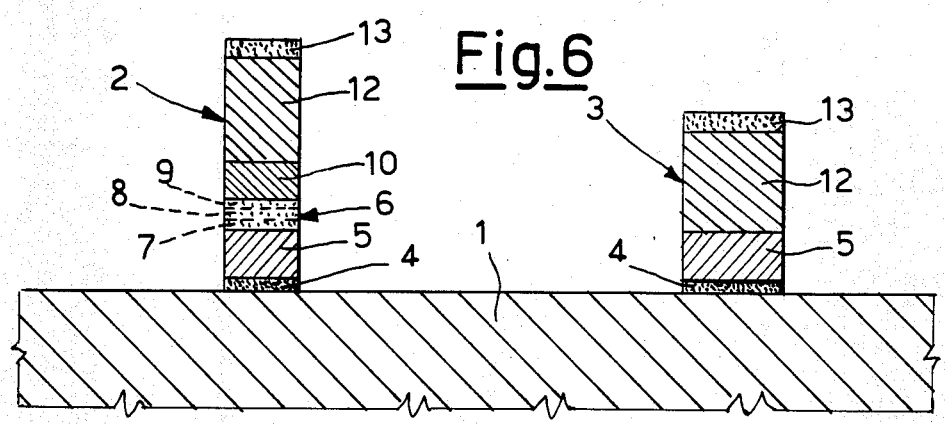

FABRICATION PROCESS FOR EPROM CELLS WITH OXIDE-NITRIDE-OXIDE DIELECTRIC

DESCRIPTION

The present invention relates to a fabrication process for EPROM cells with oxide-nitride-oxide intermediate dielectric.

A relatively recent development in integrated circuit fabrication techniques has indicated the use of a dielectric with a triple oxide-nitride-oxide layer (ONO, as will be often indicated below) in place of the more usual single silicon oxide layer as being profitable. Specifically the ONO dielectric proved to be profitable concerning electrical properties such as low leakage currents, the high voltage of dielectric breakage, but especially reduced defects with low electrical fields.

It was natural to think of using a triple ONO layer as the intermediate dielectric between two layers of polysilicon in EPROM memories which utilize particularly said properties.

Attempts made heretofore in this direction have however shown a certain criticality of essential cleaning of the surface of the ONO dielectric after removal of the masking required for forming its contours. Said cleaning is usually performed by hydrofluoric acid etching and introduces a substantial indetermination of the thickness of the top layer of oxide and has a negative influence on the reproduceability of the cell. It also necessitates the use of a top oxide layer of greater thickness than necessary with the resulting lengthening of the heat treatment required, which worsens the electrical characteristics of the triple ONO layer. Finally, in spite of all possible care in the cleaning phase, small residues from the masking tend to remain while the still uncovered dielectric tends to pick up small traces of dirt, causing defects in the dielectric.

The object of the present invention is therefore to solve the problem of contamination of the dielectric from masking material and the resulting need for cleaning so as to permit construction of EPROM cells with an ONO dielectric of good quality and reproducibility.

In accordance with the invention said object is achieved by a process comprising the deposit of a dialectric with a triple oxide-nitride-oxide layer on a first layer of polysilicon laid over a substrate having a gate oxide, application of a protective mask covering selected portions of said dielectric, removal of said dielectric at the sides of said protected portions, removal of said protective mask and deposit of a second layer of polysilicon characterized in that it comprises after deposit of the dielectric and before application of the mask the deposit of an additional layer of polysilicon deposited to protect the dielectric from said mask.

In this manner the mask does not introduce defects in the dielectric, which need not be subjected to cleaning operations with chemical etching and consequently has good quality, definite thickness and perfect reproducibility. The thickness of the top oxide layer of the dielectric can be made dependent only on required electrical performance and can be appropriately decreased together with the duration of the necessary heat treatment. Good quality and reproducibility of the dielectric are also assured by the fact that the dielectric does not remain uncoverd while awaiting the second layer of polysilicon but is always protected by the additional polysilicon layer. Moreover, the additional polysilicon layer is unaffected by large defects introduced from the mask.

The process in accordance with the invention thus makes it possible to construct EPROM cells with oxide-nitride-oxide dielectric which are unaffected by problems connected with defects and imprecision of the thickness of the dielectric.

The process in accordance with the invention used as an example in the fabrication of an EPROM memory cell with associated transistor is illustrated in detail in the annexed drawings wherein:

FIGS. 1–6 show schematically the successive steps of the above process.

FIG. 1 shows a substrate of monocrystalline silicon on which in the areas 2 and 3 designed to form an EPROM memory cell and an associated transistor have been deposited by known techniques gate oxide 4 and a first layer of polycrystalline silicon or polysilicon 5 appropriately doped.

Figure 2:
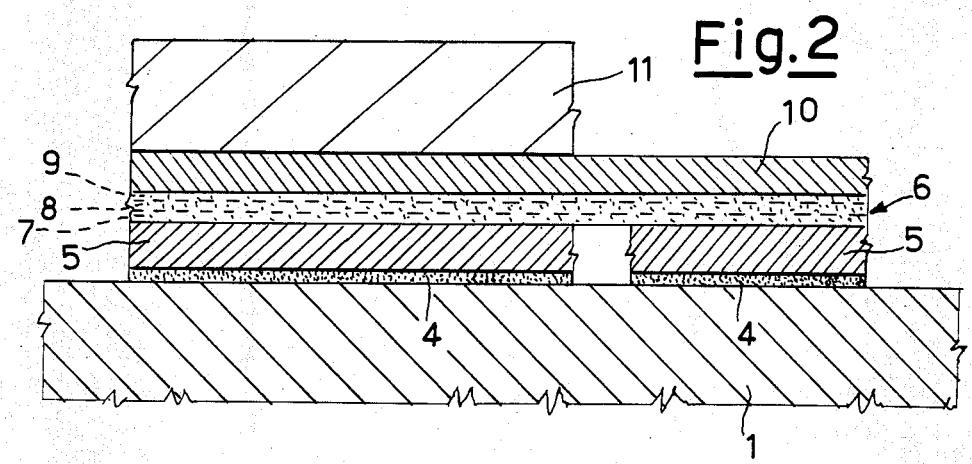

As shown in FIG. 2 over the entire structure is then formed by known techniques over a dielectric 6 consisting of a triple layer (ONO) of silicon oxide 7, silicon oxide 8 and silicon oxide 9 totalling on the order of 200–1000 Å. More precisely, a first phase of oxidation causes formation of the lower layer of oxide 7, then the intermediate layer of nitride 8 is deposited and lastly nitride oxidation is performed to form the top layer of oxide 9 preferably on the order of 20–100 Å.

On the dielectric ONO 6 is deposited immediately afterward a thin additional or 'fricticious' layer of polysilicon 10 preferably on the order of 300–2000 Å.

To the structure is then applied a mask 11 preferably of photolithographic resist which covers only the area of the EPROM cell 2 (FIG. 2).

Figure 3:
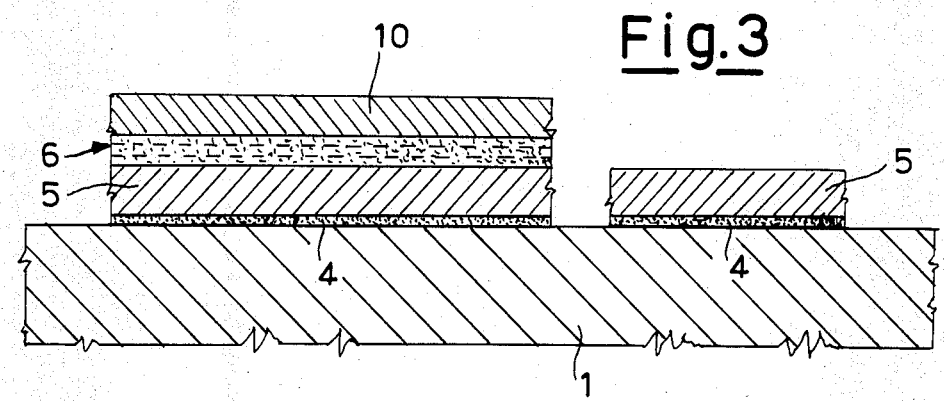

In the areas not protected by the mask 11 are then performed in succession etching of the additional layer of polysilicon 10 and ONO dielectric 6, obtaining after removal of the mask 11 the structure shown in FIG. 3. Thanks to the presence of the superimposed additional layer of polysilicon 10 the dielectric 6 has not been contaminated by the mask 11 so that it has no defects and its thickness is well established and, especially in the top layer of oxide 9 made thin enough to not require long heat treatment which would damage the underlying nitride.

At the same time the defects introduced by cleaning of the polysilicon layer 10 have far less effect on electrical performance.

On the structure thus obtained is then deposited a second layer of polysilicon 12 which by appropriate heat treatment can be made into a single piece in the cell area 2 with the underlying additional layer 10. On the aforesaid second layer 12 after appropriate doping there is formed a layer of oxide 13. The structure now appears as shown in FIG. 4.

A mask 14 is then laid over the structure to cover appropriate portions of the cell area 2 and the transistor area 3 corresponding to the desired layout for the second layer of polysilicon 12. The uncovered zones undergo in succession etching of the oxide 13, etching of the second layer of polysilicon 12 and of the additional layer 10, and lastly etching of the three layers 9, 8 and 7 of the ONO dielectric 6.

Thus is obtained the structure shown in FIG. 5 and then, by a similar masking and selfaligned etching of the layer of polysilicon 5 and the underlying gate oxide 4 at the sides of the ONO dielectric of the cell area 2, the final structure shown in FIG. 6.

We claim:

1. A process for fabricating EPROM cells comprising (a) depositing a dielectric with a triple oxide-nitride-oxide layer on a first layer of polysilicon laid over a substrate having a gate oxide, (b) depositing an additional layer of polysilicon on the dielectric to protect the dielectric from a protective mask, (c) applying a protective mask directly onto said additional polysilicon layer, said mask capable of covering selected portions of said dielectric, (d) removing said additional polysilicon layer and said dielectric from portions of the cell surface not protected by the mask, (e) removing said protective mask, and (f) depositing a second layer of polysilicon.

2. Process in accordance with claim 1, wherein said additional layer of polysilicon deposited in step (b) has a thickness on the order of 300–2000 Å.

3. Process in accordance with claim 1, wherein said dielectric has a total thickness on the order of 200–1000 Å.

4. Process in accordance with claim 3, wherein said dielectric has a top layer of oxide with a thickness on the order of 20–100 Å.

* * * * *